United States Patent
Kubota et al.

(12) 
(10) Patent No.: US 6,346,564 B1
(45) Date of Patent: Feb. 12, 2002

(54) PASTE COMPOSITION, GREEN SHEET, AND MULTILAYER SUBSTRATE

(75) Inventors: Masahiro Kubota, Shiga-ken; Shizuharu Watanabe, Omihachiman, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/528,316

(22) Filed: Mar. 20, 2000

(30) Foreign Application Priority Data

Mar. 25, 1999 (JP) .......................................... 11-081540
Apr. 5, 1999 (JP) .......................................... 11-098072

(51) Int. Cl.⁷ ................................................ C08K 3/10
(52) U.S. Cl. ...................... 524/403; 524/413; 524/435; 524/437; 524/440; 524/441; 524/442; 524/443; 524/444; 524/445
(58) Field of Search ................................. 524/403, 413, 524/435, 437, 440, 441, 442, 443, 444, 445

(56) References Cited

PUBLICATIONS

WPI Abstract Accession No. 1995–119765 [16] & JP 070045120 A (Toray), see Abstract.
WPI Abstract Accession No. 1993–365434 [46] & JP 052071576 A (Toray), see Abstract.
WPI Abstract Accession No. 1993–291834 [37] & JP 052006600 A (Asahi), see Abstract.

*Primary Examiner*—Edward J. Cain
(74) *Attorney, Agent, or Firm*—Ostrolenk, Faber, Gerb & Soffen, LLP

(57) ABSTRACT

There is disclosed a paste composition comprising a mixture of: an organic binder having an acidic functional group; at least one polyvalent metal or a polyvalent metallic compound; and an anion-adsorptive substance having the property of adsorbing an anion of said organic binder. The paste composition is capable of inhibiting gelation in a mixture of an organic binder having an acidic functional group with a polyvalent metal or a polyvalent metallic compound and is excellent in storage stability.

20 Claims, 3 Drawing Sheets

PASTE COMPOSITION, GREEN SHEET, AND MULTILAYER SUBSTRATE

BACKGROUND OF THE INVENTION

1. Field of the Invention

The present invention relates to paste compositions and green sheets each having, for example, photosensitivity, insulation properties or electrical conductivity, and to multilayer substrates obtained by the paste compositions or the green sheets.

2. Description of the Related Art

Demands have been made in recent years to provide miniaturized and high-performance high frequency electronic parts for use in, for example, mobile communication devices, satellite broadcasting reception devices and computers. In addition, wiring patterns of such high frequency electronic parts should be compliant with a higher density of the parts and accelerated signals. To achieve the higher density of the parts and accelerated signals, the wiring patters must become finer and thicker.

The wiring patterns for high frequency electronic parts have been formed by a technique which comprises the steps of mixing an electrically conductive powder containing iron, copper or another polyvalent metal with an organic vehicle including an organic binder and/or an organic solvent to yield a conductive paste, forming a wiring pattern on an insulating substrate with the use of the conductive paste, drying the patterned substrate and firing the dried substrate. Such wiring patterns are generally formed by a screen printing technique, but wiring patterns formed by this technique cannot significantly have a width and pitch less than about 50 μm.

As a possible solution to this problem, for example, Japanese Unexamined Patent Publication No. 5-287221, and Japanese Unexamined Patent Publication No. 8-227153 each propose a technique for the formation of a fine and thick film wiring pattern by a photolithographic technique using a photosensitive conductive paste. In such a photolithographic technique using a photosensitive conductive paste, the development should be preferably performed using water or an alkali from the viewpoint of environmental issues. For this purpose, an acidic functional group is introduced into the organic binder, and from the functional group a proton such as a carboxyl group or a hydroxyl group will be liberated.

When such a photosensitive organic binder is employed and the conductive material is a polyvalent metal, however, it is observed that an anion of the organic binder formed after the liberation of the proton reacts with polyvalent metal ions to form a three-dimensional network through ionic bridging to thereby cause gelation.

Japanese Unexamined Patent Publication No. 9-21850 and Japanese Unexamined Patent Publication No. 9-218508 each state that this problem can be solved by the incorporation of a phosphorus-containing compound such as phosphoric acid into a photosensitive conductive paste, or by the incorporation of an azole-structure compound such as benzotriazole into the photosensitive conductive paste, respectively. These techniques, however, only elongate the gelation time of the photosensitive conductive paste to some extent, and wiring patterns obtained by these techniques cannot be significantly used in practice.

In the aforementioned high frequency circuit components, an electrically insulating layer for isolating two or more electrode patterns or wiring patterns from each other must have a low dielectric constant and a high Q-value to achieve the miniaturization and high performance of the components. Where necessary, the electrically insulating layer includes a hole, i.e., a via hole is formed in such an electrically insulating layer for electrically connecting electrode patterns or wiring patterns formed over and under the layer with each other.

In the formation of such an electrically insulating layer, a process of forming a fine via hole through the photolithographic technique is known, as in the conductive paste. For example, Japanese Unexamined Patent Publication No. 9-110466 and Japanese Unexamined Patent Publication No. 8-50811 each disclose a process comprising the step of dispersing a powdered glass into a photosensitive organic vehicle, which organic vehicle contains an organic binder having a carboxyl group in a side chain to yield a slurry, molding the slurry into a sheet and forming a via hole through the photolithographic technique.

However, as in the photosensitive conductive paste, the anion of the organic binder formed after the liberation of the proton may react with a polyvalent metal ion such as boron or barium eluted from the glass component to form a three-dimensional network through ionic bridging thereby to yield a gel.

To ensure high frequency module substrates, high frequency electronic parts and other multilayer substrates have more functions, higher density and higher performances, it is effective to form high density wiring patterns on the substrates housing a passive component such as a capacitor or a coil.

As a process for fabricating a multilayer substrate housing a variety of passive components and having high density wiring patterns, Japanese Unexamined Patent Publication No. 9-92983 discloses a process comprising the steps of disposing a dielectric ceramic green sheet or a magnetic ceramic green sheet in the form of a sheet inside a multilayer substrate, and partially forming an inductor or a capacitor. This process requires an insulating green sheet obtained by molding a slurry comprising a mixture of a insulating ceramic material and a powdered glass or another inorganic powder with an organic vehicle into a sheet, a magnetic green sheet obtained by molding a slurry comprising a mixture of a magnetic ceramic material and a powdered glass or another inorganic powder with an organic vehicle into a sheet, or a dielectric green sheet obtained by molding a slurry comprising a mixture of a dielectric ceramic material and a powdered glass or another inorganic powder with an organic vehicle into a sheet.

Organic binders in such organic vehicles for use in the above applications often contain an acidic functional group such as a hydroxyl group in the side chain. When a powdered glass containing a polyvalent metal is added to the organic binder of this type, the anion of the organic binder may be ionically bridged with a polyvalent metal ion to cause gelation. If the insulating green sheet, magnetic green sheet, dielectric green sheet or the like is prepared by using a gelled and heterogenous slurry, cracks may be formed during firing and only multilayer substrates having a low reliability could be obtained.

SUMMARY OF THE INVENTION

To overcome the above described problems, preferred embodiments of the present invention provide a paste composition which is capable of inhibiting gelation in a mixture of an organic binder having an acidic functional group with a polyvalent metal or a polyvalent metallic compound and is excellent in storage stability and characteristics after firing.

Further, preferred embodiments of the present invention provide a green sheet which is capable of inhibiting gelation in a mixture of an organic binder having an acidic functional group with a glass material or a ceramic material and has an excellent storage stability and a satisfactory reliability after firing.

Further, preferred embodiments of the present invention provide a multilayer substrate which is capable of highly precisely forming a circuit pattern in high density and has an excellent reliability.

After intensive investigations to solve the above problems, the present inventors found that gelation of a system including a mixture of an organic binder having an acidic functional group with a polyvalent metal and/or a polyvalent metallic compound can be effectively inhibited by the incorporation of hydroxyapatite or another anion-adsorptive substance into the system.

Specifically, they found that when hydroxyapatite or another anion-adsorptive substance is added to a system containing an organic binder having an acidic functional group that will release a proton, the anion of the organic binder formed after the liberation of the proton is adsorbed by the anion-adsorptive substance to form a microstructure such as a microphase separation in the mixture; and that this configuration can prevent the formation of a three-dimensional network through ionic bridging even when a polyvalent metal and/or a polyvalent metallic compound is incorporated into the system to thereby inhibit the gelation of the system.

One preferred embodiment of the present invention provides a paste composition (hereinafter referred to as "the invented paste composition") including a mixture of:

an organic binder having an acidic functional group;

at least one selected from the group consisting of a polyvalent metal and a polyvalent metallic compound; and an anion-adsorptive substance having the property of adsorbing an anion of the organic binder.

Another preferred embodiment of the present invention provides a green sheet (hereinafter referred to as "the invented green sheet") obtained by molding a slurry into a sheet, which slurry includes a mixture of:

an organic binder having an acidic functional group;

a polyvalent metallic compound; and an anion-adsorptive substance having the property of adsorbing an anion of the organic binder.

The invention provides, in a further aspect, a multilayer substrate obtained by laminating the invented paste composition through thick film screen printing and firing the laminate.

The invention provides, in yet another aspect, a multilayer substrate obtained by laminating and firing the invented green sheet.

The invented paste composition, in which an anion-adsorptive substance is incorporated into a paste composition containing an organic binder having an acidic functional group and a polyvalent metal and/or a polyvalent metallic compound, can inhibit the gelation in a mixture of the organic binder and the polyvalent metal and/or polyvalent metallic compound and has a satisfactory storage stability.

The invented green sheet, in which an anion-adsorptive substance is incorporated into a slurry containing an organic binder having an acidic functional group and a polyvalent metallic compound, can inhibit the gelation in a mixture of the organic binder and the polyvalent metallic compound such as a glass material or ceramic material and has an excellent storage stability and a satisfactory reliability after firing.

The invented multilayer substrate has, for example, its conductive layer or insulating layer formed by the invented paste composition or has its insulating layer formed by the invented green sheet. The invented multilayer substrate is therefore capable of highly precisely forming, for example, a wiring pattern or a via hole in a high density and is excellent in strength and other characteristics after firing.

Other features and advantages of the present invention will become apparent from the following description of the invention which refers to the accompanying drawings.

DETAILED DESCRIPTION OF EMBODIMENTS OF THE INVENTION

Figure 1:
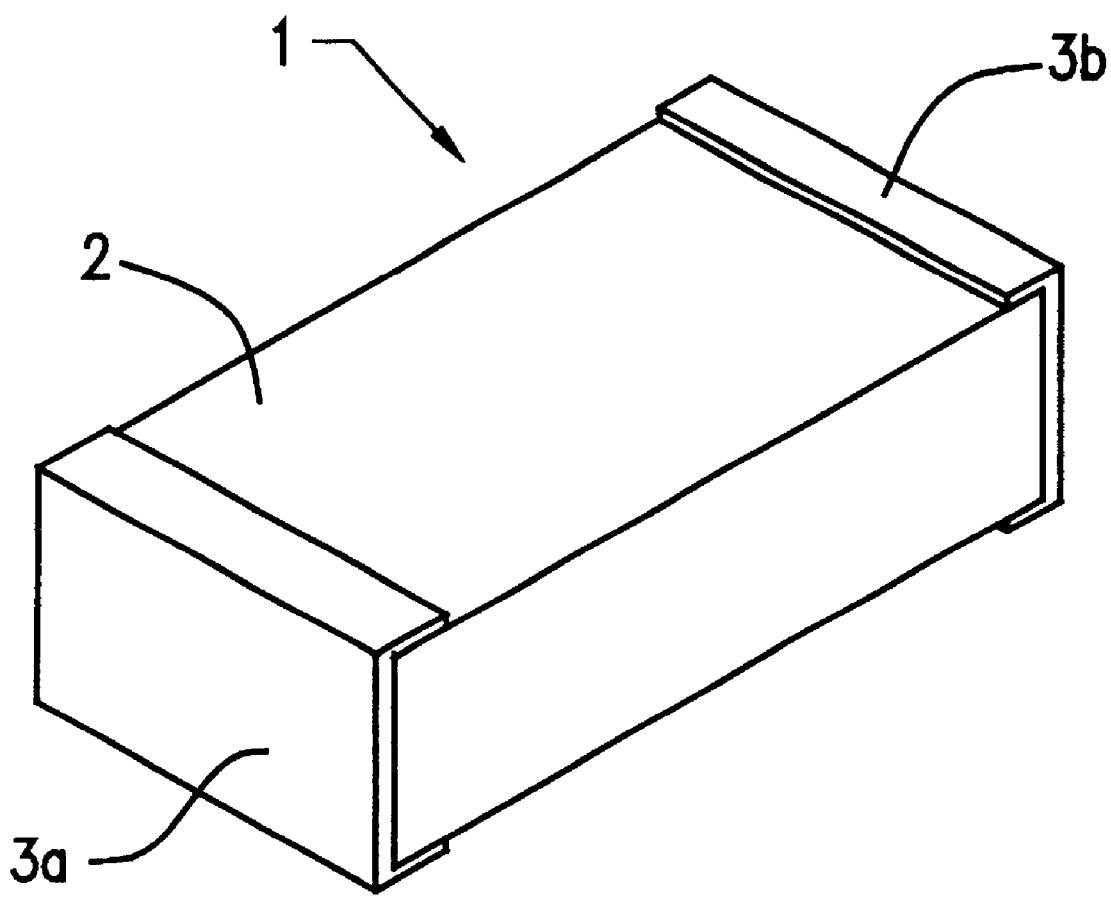
FIG. 1 is a schematic single view diagram of a chip inductor formed by the invented paste composition.

The anion-adsorptive substance in the invented paste composition is preferably at least one selected from the group consisting of hydroxyapatite, hydrotalcite, zirconium phosphate and antimony oxide hydrate.

The anion-adsorptive substance is preferably a fine particle having a mean particle diameter of about 0.01 to 50 $\mu$m. The anion-adsorptive substance being a fine particle having a particle diameter within this range can effectively adsorb the anion of the organic binder.

The content of the anion-adsorptive substance is preferably about 0.001 to 30% by weight, and more preferably about 0.1 to 10% by weight based on the total weight of the paste composition. If the content of the anion-adsorptive substance is less than about 0.001% by weight, the gelation of the paste composition may not be sufficiently inhibited. In contrast, if the content exceeds about 30% by weight, the sinterability of the paste composition may be deteriorated.

Resins having anion-exchange property can be used as the anion-adsorptive substance, in addition to the above substances. Such resins mainly comprise a copolymer of divinylbenzene, trivinylbenzene, trimethylolpropane trimethacrylic acid ester, or ethylene glycol dimethacrylic acid ester with an acrylate, a methacrylate, or acrylonitrile and have a primary, secondary, tertiary or quaternary amino group as an ion exchange group introduced into the copolymer.

The organic binder may be an acrylic copolymer having a carboxyl group in a side chain. Such an organic binder is effective as a photosensitive organic binder, but the anion thereof is readily ionically bridged with the ion of the polyvalent metal. The advantage of the addition of the anion-adsorptive substance is remarkably exhibited in organic binders of this type.

The acrylic copolymer can be prepared by copolymerizing an unsaturated carboxylic acid (or anhydride)and an ethylenically unsaturated compound. Such unsaturated carboxylic acids include, but are not limited to, acrylic acid, methacrylic acid, maleic acid, fumaric acid and vinylacetic acid. Anhydrates of these acids can also be used. Such ethylenically unsaturated compounds include, for example, methyl acrylate, ethyl acrylate and other acrylic esters, methyl methacrylate, ethyl methacrylate and other methacrylic esters, monoethyl fumarate and other fumaric esters. Alternatively, an unsaturated bond may be introduced into these compounds by subjecting the obtained copolymer to an oxidation treatment or another treatment.

The invented paste composition may further comprise a photosensitive organic component in addition to the organic binder having an acidic functional group, the polyvalent metal and/or polyvalent metallic compound, and the anion-adsorptive substance. In this case, the paste composition has photosensitivity.

The photosensitive organic component includes known photopolymerizable or photomodifiable compounds such as:
(1) mixtures of a monomer or an oligomer having an unsaturated group or another reactive functional group with an aromatic carbonyl compound or another radical generator activated by light,
(2) so-called diazo resins such as condensates of an aromatic bisazide with formamide,
(3) mixtures of an epoxy compound or another addition-polymerizable compound with a diallyl iodonium salt or another acid generator activated by light, and
(4) naphthoquinonediazide compounds.

Among them, mixtures of a monomer or an oligomer having an unsaturated group or another reactive functional group with an aromatic carbonyl compound or another radical generator activated by light are typically preferred.

Such monomers and oligomers each containing a reactive functional group include, but are not limited to, hexanediol triacrylate, tripropylene glycol triacrylate, trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,3-butanediol diacrylate, 1,4-butanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl)isocyanurate triacrylate, ethoxylated trimethylolpropane triacrylate, pentaerythritol triacrylate, propoxylated trimethylolpropane triacrylate, propoxylated glyceryl triacrylate, pentaerythritol tetraacrylate, ditrimethylolpropane tetraacrylate, dipentaerythritol hydroxypentaacrylate, ethoxylated pentaerythritol tetraacrylate, tetrahydrofurfuryl methacrylate, cyclohexyl methacrylate, isodecyl methacrylate, lauryl methacrylate, triethylene glycol dimethacrylate, ethylene glycol dimethacrylate, tetraethylene glycol dimethacrylate, 1,4-butanediol dimethacrylate, diethylene glycol dimethacrylate, 1,6-hexanediol dimethacrylate, neopentyl glycol dimethacrylate, 1,3-butylene glycol dimethacrylate, ethoxylated bisphenol A dimethacrylate and trimethylolpropane trimethacrylate.

The radical generator activated by light includes, but is not limited to, benzil, benzoin ethyl ether, benzoin isobutyl ether, benzoin isopropyl ether, benzophenone, benzoylbenzoic acid, methyl benzoylbenzoate, 4-benzoyl-4-methyldiphenyl sulfide, benzyl dimethyl ketal, 2-n-butoxy-4-dimethyl-aminobenzoate, 2-chlorothioxanthone, 2,4-diethylthioxanthone, 2,4-diisopropylthioxanthone, isopropylthioxanthone, 2-dimethylaminoethyl benzoate, ethyl p-dimethylaminobenzoate, isoamyl p-dimethylaminobenzoate, 3,3-dimethyl-4-methoxybenzophenone, 2,4-dimethylthioxanthone, 1-(4-dodecylphenyl)-2-hydroxy-2-methylpropan-1-one, 2,2-dimethoxy-1,2-diphenylethan-1-one, hydroxycyclohexyl phenyl ketone, 2-hydroxy-2-methyl-1-phenylpropan-1-one, 1-[4-(2-hydroxyethoxy)-phenyl]-2-hydroxy-2-methyl-1-propan-1-one, 2-methyl-1-[4-(methylthio)phenyl]-2-morpholinopropan-1-one, methylbenzoyl formate, 1-phenyl-1,2-propanedione-2-(o-ethoxycarbonyl) oxime, 2-benzyl-2-dimethylamino-1-(4-morpholinophenyl)-1-butanone, bis(2,6-dimethoxybenzoyl)-2,4,4-trimethylpentylphosphine oxide and bis(2,4,6-trimethylbenzoyl)phenylphosphine oxide.

Where necessary, the invented paste composition may further comprise, for example, any additives such as polymerization inhibitors and stabilizers for storage, antioxidants, dyestuffs, pigments, antifoaming agents, surfactants and solvents.

In the invented paste composition, the polyvalent metal may be at least one powdery metal selected from the group consisting of copper, aluminum, palladium, nickel and iron. In this case, the invented paste composition is a conductive paste for the formation of a variety of conductive patterns.

Conductive materials for use in conductive pastes generally include Cu, Al, Pd, Ni, Fe, Pt, Au, Ag, Mo, W and alloys of these metals. Of these polyvalent metals, Cu, Al, Pd, Ni and Fe are particularly highly ionizable in a paste and are liable to react with anions of an organic binder to thereby cause gelation. Even in such a conductive paste, the gelation of the paste can effectively inhibited according to the featured configuration of the invention by incorporating hydroxyapatite or another anion-adsorptive substance into the paste.

The invented paste composition may comprise, as the polyvalent metallic compound, a powdered glass and/or a powdered ceramic containing at least one of boron, barium, magnesium, aluminum, calcium, lead, bismuth, copper, zinc, zirconium, niobium, chromium, strontium and titanium. In this case, the invented paste composition is an insulating paste for the formation of, for example, an insulating layer.

Insulating materials for use in insulating pastes generally include polyvalent metallic compounds such as a powdered glass or a powdered ceramic of $SiO_2$—$PbO$, $SiO_2$—$ZnO$, $SiO_2$—$Bi_2O_3$, $SiO_2$—$K_{20,\ SiO2}$—$Na_2O$, $SiO_2$—$PbO$—$B_2O_3$, $SiO_2$—$ZnO$—$B_2O_3$, $SiO_2$—$Bi_2O_3$—$B_2O_3$, $SiO_2$—$K_2O$—$B_2O_3$ or $SiO_2$—$Na_2O$—$B_2O_3$ systems. Of these polyvalent metallic compounds, polyvalent metallic ions derived from B, Ba, Mg, Al, Ca, Pb, Bi, Cu, Zn, Zr, Nb, Cr, Sr and Ti are particularly liable to cause gelation through ionic bridging with an anion of the organic binder. Even in such an insulating paste, the gelation of the paste can effectively inhibited according to the featured configuration of the invention by incorporating hydroxyapatite or another anion-adsorptive substance into the paste composition.

As thus described, the invented paste composition can be used as a conductive paste or an insulating paste by appropriately selecting the polyvalent metal and/or the polyvalent metallic compound. The paste composition can also be used as a photosensitive conductive paste or a photosensitive insulating paste by adding a photosensitive organic component.

For example, a photosensitive conductive paste according to the invention is applied onto an alumina substrate or another substrate by a spin coating, screen printing, doctor blade process or another technique and is exposed and is then developed. The developed substrate is degreased and is then fired to yield a target conductive pattern.

A multilayer substrate obtained by laminating and firing the photosensitive conductive paste and the photosensitive insulating paste through thick film screen printing will be described below. In this explanation, a chip coil is taken as an example of the multilayer substrate.

Figure 2:
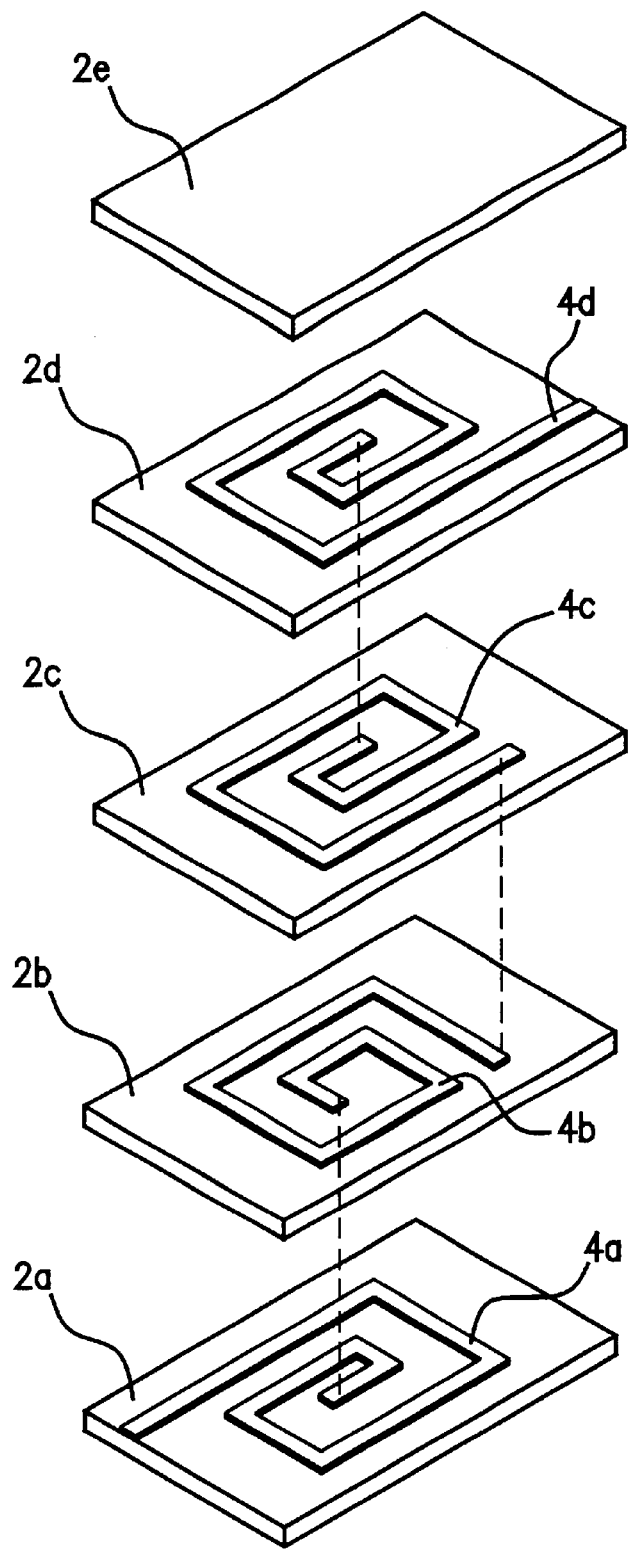
FIG. 2 is an exploded diagram of the chip inductor.

As shown in FIGS. 1 and 2, a chip coil 1 includes a substrate 2. The substrate 2 is formed by laminating an insulating layer 2b, an insulating layer 2c, an insulating layer 2d, and an insulating layer 2e on an insulating substrate 2a composed of, for example, alumina through thick film screen printing. External electrodes 3a and 3b formed on the sides of the substrate 2, and internal electrodes 4a, 4b, 4c, and 4d formed inside the substrate 2.

Specifically, the substrate 2 comprises, inside thereof, the internal electrodes 4a, 4b, 4c, and 4d for the formation of coil patterns respectively formed between the insulating substrate 2a and the insulating layer 2b, between the insulating layers 2b and 2c, between the insulating layers 2c and 2d and between the insulating layers 2d and 2e. The internal electrode 4a provided between the insulating substrate 2a and the insulating layer 2b is connected to the external electrode 3a, and the internal electrode 4d provided between the insulating layers 2d and 2e is connected to the external electrode 3b.

Furthermore, the internal electrode 4a provided between the insulating substrate 2a and the insulating layer 2b is electrically connected through a via hole (not shown) formed in the insulating layer 2b to the internal electrode 4b provided between the insulating layers 2b and 2c. Likewise, the internal electrode 4b to the internal electrode 4c and the internal electrode 4c to the internal electrode 4d are respectively electrically connected through via holes (not shown) each formed in the insulating layer 2c and the insulating layer 2d.

The chip coil 1 can be prepared by, for example, the following technique.

Initially, as shown in FIG. 2, a photosensitive conductive paste according to the invention is applied onto the insulating substrate 2a composed of, for example, alumina, by screen printing, spin coating, doctor blade process or another technique. The substrate is then dried and is exposed for imaging a target pattern through a photo mask patterned with the target pattern. As the exposure treatment, for example, an actinic radiation from a high pressure mercury lamp can be irradiated in an exposure dose of 20 to 5000 mJ/cm$^2$.

The exposed substrate is then developed with an alkali aqueous solution such as a sodium carbonate aqueous solution to remove unnecessary portions, and is subjected to degreasing. The degreased substrate is then fired, for example, at 850° C. in the air for about 1 hour to form the spiral internal electrode 4a.

Next, a photosensitive insulating paste according to the invention is applied on all of the chip so as to cover the internal electrode 4a formed on the insulating substrate 2a. The applied substrate is then dried and is exposed through a photo mask for patterning a via hole, for example, 50 $\mu$m in diameter. The exposure can be performed under a similar condition to that mentioned above. The exposed substrate is then developed with an alkali aqueous solution such as a sodium carbonate aqueous solution to remove unnecessary portions, and is fired at a given temperature in the air for a given time to form the insulating layer 2b having a hole for a via hole (not shown).

A conductive paste is charged into the hole for a via hole and is dried to form a via hole (not shown) for connecting an end of the internal electrode 4a to an end of the internal electrode 4b. The spiral internal electrode 4b is then formed in a similar manner to that mentioned above.

Likewise, the insulating layer 2c, the internal electrode 4c, the insulating layer 2d and the internal electrode 4d are formed in turn in the same manner as above. The insulating layer 2e is then formed for protection, and further the external electrodes 3a and 3b are provided to yield the chip coil 1 having a laminate structure comprising internal electrodes and insulating layers as shown in FIG. 1.

According to the above fabricating process, the invented photosensitive conductive paste is used for the formation of the internal electrodes 4a, 4b, 4c and 4d, and fine conductive patterns can be easily formed with good work shapes. In addition, the invented photosensitive insulating paste is employed for the formation of the insulating layers 2b, 2c, 2d and 2e, and fine via holes can be easily obtained with good work shapes.

Specifically, the invented photosensitive conductive paste exhibits less changes with time in viscosity due to gelation, and can therefore inhibit, for example, printing bleeding caused by deterioration of viscosity and can highly precisely yield fine lines having a line/space value of less than 50/50 $\mu$m as thick films. Likewise, the invented photosensitive insulating paste exhibits less change with time in viscosity due to gelation, and can therefore inhibit, for example, printing bleeding caused by deterioration of viscosity and can highly precisely yield ultrafine via holes having a diameter of less than 150 $\mu$m, particularly less than 50 $\mu$m. Accordingly, the invention can provide substrates and circuit electronic parts that are sufficiently miniaturized and have a satisfactorily high density.

Multilayer substrates using the invented paste composition are not limited to the above chip coil 1 and include, for example, chip capacitors, chip CL filters, and other high frequency circuit electronic parts, as well as VCO (Voltage Controlled Oscillator), PLL (Phase Locked Loop), and other high frequency modules and other high frequency substrates.

The photolithographic technique using the invented photosensitive paste can be applied not only to the above application but also to the formation of, for example, insulating barriers and electrode patterns of plasma display panels.

The invented green sheet will now be described in more detail.

In the invented green sheet, the anion-adsorptive substance should preferably be at least one selected from the group consisting of hydroxyapatite, hydrotalcite, zirconium phosphate and antimony oxide hydrate. In addition to these substances, resins similar to those mentioned above can also be employed.

The anion-adsorptive substance is preferably a fine particle having a mean particle diameter of about 0.01 to 50 $\mu$nm. The anion-adsorptive substance being a fine particle having a particle diameter within this range can effectively adsorb an anion of the organic binder.

The content of the anion-adsorptive substance is preferably about 0.001 to 30% by weight, and more preferably about 0.1 to 10% by weight based on the total weight of the slurry for green sheet. If the content of the anion-adsorptive substance is less than about 0.001% by weight, gelation of the resulting green sheet may not significantly be inhibited, in contrast, if the content exceeds about 30% by weight, the sinterability of the green sheet may be deteriorated.

The organic binder may be an acrylic copolymer having a carboxyl group in a side chain. Such an organic binder is highly effective as a photosensitive organic binder, but an anion thereof is liable to ionically bridge with an ion of the polyvalent metal. The advantage of the addition of the anion-adsorptive substance remarkably exhibits in organic binders of this type. The acrylic copolymer can be prepared by the aforementioned technique using the compounds of the above types.

The invented green sheet may further comprise a photosensitive organic component in addition to the organic binder having an acidic functional group, the polyvalent metallic compound, and the anion-adsorptive substance. The photosensitive organic component includes photopolymerizable or photomodifiable compounds similar to those described above. Specifically, the invented green sheet may be a photosensitive green sheet.

Where necessary, the slurry for the formation of the invented green sheet may further comprise, for example, any additives such as polymerization inhibitors and other stabilizers for storage, antioxidants, dyestuffs, pigments, antifoaming agents, surfactants and solvents.

The polyvalent metallic compound in the invented green sheet may be a powdered glass and/or a powdered ceramic containing at least one polyvalent metal selected from the group consisting of boron, barium, magnesium, aluminum, calcium, lead, bismuth, copper, zinc, zirconium, niobium, chromium, strontium and titanium.

Constitutive materials for use in green sheets generally include polyvalent metallic compounds such as a powdered glass (including a powdered crystallized glass) or a powdered ceramic of $SiO_2$—$PbO$, $SiO_2$—$ZnO$, $SiO_2$—$Bi_2O_3$, $SiO_2$—$K_2O$, $SiO_2$—$Na_2O$, $SiO_2$—$PbO$—$B_2O_3$, $SiO_2$—$ZnO$—$B_2O_3$, $Bi_2O_3$—$B_2O_3$, $SiO_2$—$K_2O$—$B_2O_3$, or $SiO_2$—$Na_2O$—$B_2O_3$ systems. Of these polyvalent metallic compounds, polyvalent metallic ions derived from B, Ba, Mg, Al, Ca, Pb, Bi, Cu, Zn, Zr, Nb, Cr, Sr and Ti are particularly liable to cause gelation when mixed with an organic binder having, for example, a carboxyl group. Even if such polyvalent metallic compounds are used, the invented green sheet can effectively inhibit the gelation of the slurry by incorporating hydroxyapatite or another anion-adsorptive substance into the slurry.

The invented green sheet can comprise a dielectric ceramic powder or a magnetic ceramic powder as a main constitutive material. When such a dielectric ceramic powder or a magnetic ceramic powder is employed, a glass or a crystallized glass may be added to the powder. In other words, the invented green sheet can be, for example an insulating green sheet, a dielectric green sheet, or a magnetic green sheet.

A multilayer substrate obtained by laminating and firing the invented green sheet will now be described.

Figure 3:
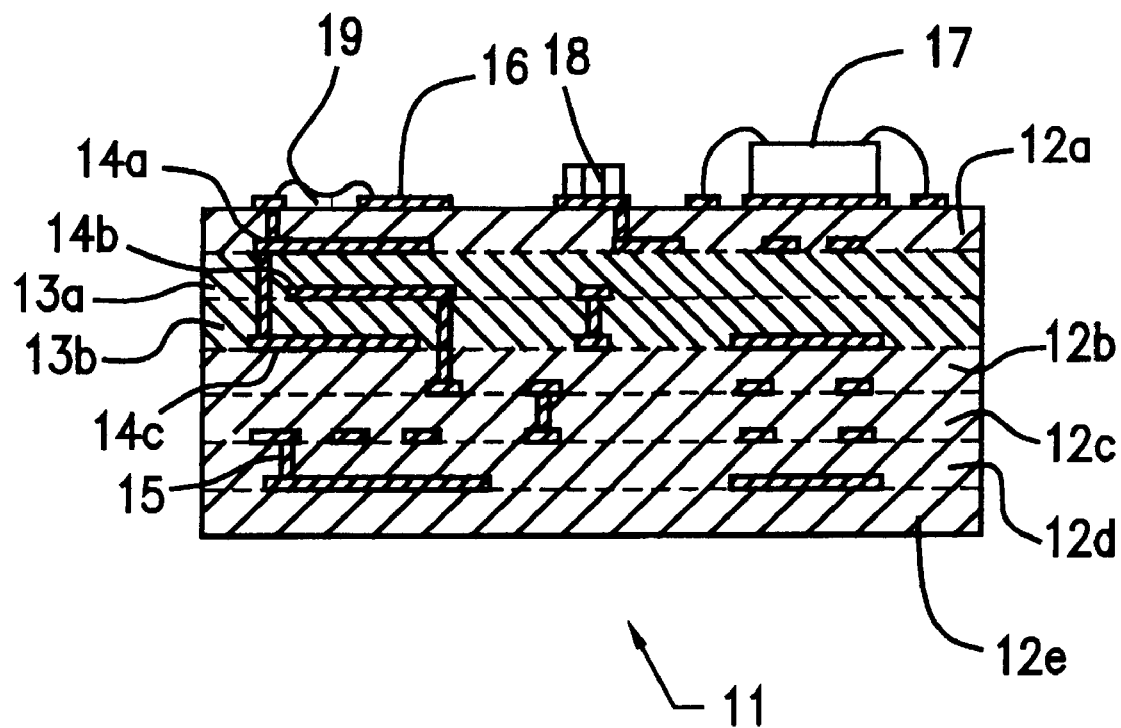
FIG. 3 is a schematic cross sectional view of a multilayer substrate formed by the invented green sheet.

A multilayer substrate 11 shown in FIG. 3 comprises insulating layers 12a, 12b, 12c, 12d and 12e which are insulative, and dielectric layers 13a and 13b which are highly dielectric. One main plane of the multilayer substrate includes, for example, electrode pads and wiring patterns formed thereon by a surface layer conductor 16. Inside the multilayer substrate 11, striplines and other wiring patterns, coils, capacitors and other electrode patterns, and via holes, are formed by, for example, internal layer conductors 14a, 14b, 14c and 15. On the one main plane of the multilayer substrate 11, a semiconductor IC 17, a chip capacitor or another chip component 18, a thick film resistor 19 and the like are provided and are respectively connected to the surface layer conductor 16, and the internal layer conductors 14a, 14b, 14c and 15.

The multilayer substrate 11 is fabricated, for example, in the following manner.

Initially, given amounts of a powdered glass and a powdered ceramic, a photosensitive organic vehicle containing an organic binder having an acidic functional group, and an anion-adsorptive substance are mixed and dispersed to yield a slurry for photosensitive dielectric green sheet. Similarly, a slurry for photosensitive insulating green sheet is prepared.

The obtained slurries are each molded into sheets by, for example, the doctor blade process to yield a photosensitive dielectric green sheet and a photosensitive insulating green sheet. Predetermined patterns are then formed on each of the green sheets using a conductive paste. As this paste, the invented photosensitive conductive paste can be used.

Where necessary, a via hole is formed on each green sheet. The via hole can be fabricated by exposing the green sheet for the formation of a pattern for via hole 50 $\mu$m in diameter through a photo mask, developing the patterned green sheet with, for example, an alkali aqueous solution to remove unnecessary portions to thereby form a hole for via hole, and charging the conductive paste into the hole. Conditions for exposure and development may be the same with those described above.

The green sheets on which conductive patterns and via holes are formed are laminated, and the resulting laminate is subjected to compression bonding and is fired to yield the multilayer substrate 11. Subsequently, a surface layer conductive pattern is formed with the invented photosensitive conductive paste, the chip component 18 and the semiconductor IC 17 are mounted and the thick film resistor 19 is printed to yield a multilayer circuit component (a multilayer module).

According to this fabricating process, the invented photosensitive insulating green sheet is employed for the formation of the insulating layers 12a, 12b, 12c, 12d and 12e, and green sheets having fine via holes can be easily obtained with good work shapes. In addition, the invented photosensitive dielectric green sheet is used for the formation of the dielectric layers 13a and 13b, and green sheets having fine via holes can be easily fabricated with good work shapes. When the invented photosensitive conductive paste is used for the formation of the internal layer conductors 14a, 14b and 14c, the via hole 15 and the surface layer conductor 16, fine electrode patterns can be easily formed with good work shapes.

The invented photosensitive green sheet exhibits less changes with time in viscosity due to gelation, and can therefore inhibit, for example, printing bleeding caused by deterioration of viscosity and can highly precisely yield ultrafine via holes having a diameter of less than 150 $\mu$m, particularly less than 50 $\mu$m. The invented green sheet can therefore provide substrates and circuit electronic parts that are sufficiently miniaturized and have a satisfactorily high density.

In the above embodiment of the fabricating process, the invented photosensitive green sheets are used for the formation of the insulating layers 12a, 12b, 12c, 12d and 12e, and the dielectric layers 13a and 13b. Alternatively, it is also effective to form one of the insulating layers and the dielectric layers by a photosensitive green sheet and the other by a usual green sheet. A multilayer substrate having a coil pattern embedded inside can also be fabricated, which coil pattern is obtained by the use of the invented magnetic green sheet.

Multilayer substrates using the invented green sheet are not limited to the above multilayer substrate 11 and include, for example, chip capacitors, chip CL filters, and other high frequency circuit electronic parts, as well as VCO (Voltage Controlled Oscillator), PLL (Phase Locked Loop), and other high frequency modules.

The insulating layers 12a, 12b, 12c, 12d and 12e, and the dielectric layers 13a and 13b can also be fabricated by using green sheets not having photosensitivity instead of the photosensitive green sheets, as far as they have the invented configuration.

EXAMPLES

The invention will be illustrated in further detail with reference to examples of the photosensitive conductive paste, photosensitive insulating paste and green sheet.

Example 1 (Photosensitive Conductive Paste)

Components having the following compositions were mixed, and the resulting mixture was kneaded with a three-roll mill to yield a photosensitive conductive paste.
Organic Binder
  methyl methacrylate having a carboxyl group: 2.0 g
Anion-adsorptive Fine Particle
  hydroxyapatite (mean particle diameter 5 m$\mu$): 0.1 g
Conductive Material
  powdered copper: 9.0 g
Monomer Having a Reactive Functional Group
  trimethylolpropane triacrylate: 1.0 g
Photopolymerization Initiator
  2-methyl-1-[4-(methylthio)phenyl]-2-morpholinopropan-1-one: 0.4 g
  2,4-diethylthioxanthone: 0.1 g
Organic Solvent
  ethyl carbitol acetate: 4.0 g
  propylene glycol monomethyl ether acetate: 1.0 g

Comparative Example 1 (Photosensitive Conductive Paste)

A photosensitive conductive paste was prepared in the same manner as in Example 1 except that hydroxyapatite was not used.

Comparative Example 2 (Photosensitive Conductive Paste)

A photosensitive conductive paste was prepared in the same manner as in Example 1, except that hydroxyapatite was not used and that 0.1 g of phosphoric acid was used as an additive.

Comparative Example 3 (Photosensitive Conductive Paste)

A photosensitive conductive paste was prepared in the same manner as in Example 1, except that hydroxyapatite was not used and that 0.02 g of benzotriazole was used as an additive.

The obtained photosensitive conductive pastes according to Example 1 and Comparative Examples 1 to 3 were stored at 20° C. in the air for the periods indicated in Table 1 below. A conductive pattern was then to be formed onto an alumina substrate by the lithographic technique using each of the photosensitive conductive pastes after storage.

The conductive pattern was formed in the following manner.

Each photosensitive conductive paste was applied onto an alumina substrate with a spin coating device, and was dried at 50° C. for 1 hour to yield a film 10 $\mu$m thick. Through a mask patterned with a conductive pattern having a line/space (L/S) of 20/20 ($\mu$m), radiation from a high pressure mercury lamp was irradiated to the film in an exposure dose of 250 mJ/cm$^2$ for the exposure treatment. Subsequently, the film was developed with a sodium carbonate aqueous solution to form a pattern having an L/S of 20/20 ($\mu$m), and the patterned film was further degreased and was then fired at 900° C. in an N$_2$ atmosphere to yield a conductive pattern having an L/S of 10/30 ($\mu$m).

The measured storage stability of the photosensitive conductive paste according to Example 1 and Comparative Examples 1 to 3 is shown in Table 1 below. In Table 1, the symbol "O" means that the photosensitive conductive paste was not gelled and could be applied onto the substrate, and the symbol "X" means that the photosensitive conductive paste was gelled and could not be applied onto the substrate.

TABLE 1

Storage Stability of Photosensitive Conductive Paste

| | Additive | Immediately after | 1 day | 3 days | 1 week | 1 month |
|---|---|---|---|---|---|---|
| Example 1 | hydroxyapatite | O | O | O | O | O |
| Comp. Ex. 1 | none | O | X | X | X | X |
| Comp. Ex. 2 | phosphoric acid | O | O | O | O | X |
| Comp. Ex. 3 | benzotriazole | O | O | O | O | X |

Table 1 shows that the photosensitive conductive paste according to Example 1 was not gelled at any point of time of immediately after the preparation, 1 day, 3 days, 1 week and 1 month after the preparation, and could satisfactorily serve for the application with a spin coating device and for the formation of a fine conductive pattern.

In contrast, the photosensitive conductive paste of Comparative Example 1 was gelled after 1-day storage. The photosensitive conductive pastes of Comparative Examples 2 and 3 could serve for the application and pattern formation immediately after the preparation and after 1-week storage, but they were gelled and could not be applied onto a substrate with a spin coating device after 1-month storage.

Example 2 (Photosensitive Insulating Paste)

Components having the following compositions were mixed and the resulting mixture was kneaded with a three-roll to yield a photosensitive insulating paste.
Organic Binder
  methyl methacrylate having a carboxyl group: 2.0 g
Anion-adsorptive Fine Particle
  hydroxyapatite (mean particle diameter 5 m$\mu$): 0.1 g
Powdered Glass
  powdered SiO$_2$—K$_2$O—B$_2$O$_3$ glass (boron content 17%): 5.0 g
Monomer Having Reactive Functional Group
  trimethylolpropane triacrylate: 1.0 g
Photopolymerization Initiator
  2-methyl-1-[4-(methylthio)phenyl]-2-morpholinopropan-1-one: 0.4 g
  2,4-diethylthioxanthone: 0.1 g
Organic Solvent
  ethyl carbitol acetate: 4.0 g
  propylene glycol monomethyl ether acetate: 1.0 g

Comparative Example 4 (Photosensitive Insulating Paste)

A photosensitive insulating paste was prepared in the same manner as in Example 2, except that hydroxyapatite was not used.

Comparative Example 5 (Photosensitive Insulating Paste)

A photosensitive insulating paste was prepared in the same manner as in Example 2, except that hydroxyapatite was not used and that 0.1 g of phosphoric acid was used as an additive.

Comparative Example 6 (Photosensitive Insulating Paste)

A photosensitive insulating paste was prepared in the same manner as in Example 2, except that hydroxyapatite was not used and that 0.02 g of benzotriazole was used as an additive.

The obtained photosensitive insulating pastes according to Example 2 and Comparative Examples 4 to 6 were stored at 20° C. in the air for the periods indicated in Table 2 below. Each of the photosensitive insulating pastes after storage was applied onto an alumina substrate, and a via hole was then to be formed by the lithographic technique.

The via hole was formed in the following manner.

Each photosensitive insulating paste was applied onto an alumina substrate with a spin coating device, was dried at 50° C. for 1 hour to yield a film 30 μm thick. Through a mask patterned with a 30 μmf via hole pattern, radiation from a high pressure mercury lamp was irradiated to the film in an exposure dose of 250 mJ/cm$^2$ for the exposure treatment. Subsequently, the film was developed with a sodium carbonate aqueous solution to form a 30 μmf via hole, and the patterned film was degreased and was then fired at 900° C. in an $N_2$ atmosphere to yield a 15-μm thick electrically insulating layer having a 30 μmf via hole.

The measured storage stability of the photosensitive insulating pastes according to Example 2 and Comparative Examples 4 to 6 is shown in Table 2 below. In Table 2, the symbol "O" means that the photosensitive insulating paste was not gelled and could be applied onto the substrate, and the symbol "X" means that the photosensitive insulating paste was gelled and could not be applied onto the substrate.

TABLE 2

Storage Stability of Photosensitive Insulating Paste

| | Additive | Immediately after | 1 day | 3 days | 1 week | 1 month |
|---|---|---|---|---|---|---|
| Example 2 | hydroxyapatite | O | O | O | O | O |
| Comp. Ex. 4 | none | X | X | X | X | X |
| Comp. Ex. 5 | phosphoric acid | O | X | X | X | X |
| Comp. Ex. 6 | benzotriazole | X | X | X | X | X |

Table 2 shows that the photosensitive insulating paste of Example 2 was not gelled at any point of time of immediately after the preparation, 1 day, 3 days, 1 week, and 1 month after the preparation, and could satisfactorily serve for the application with a spin coating device and for the formation of a fine via hole.

In contrast, the photosensitive insulating pastes of Comparative Examples 4 and 6 were gelled immediately after the preparation. The photosensitive insulating paste of Comparative Example 5 could serve for the application and pattern formation immediately after the preparation, but the paste was gelled and could not be applied onto a substrate with a spin coating device after 1-day storage and thereafter.

Example 3 (Insulating Green Sheet)

To 37.3% by weight of a powdered borosilicate glass, 24.9% by weight of a powdered alumina, 6.2% by weight of an organic binder of a carboxyl-group-containing acrylic type, 3.1% by weight of ethanol and 0.5% by weight of hydroxyapatite were added and mixed to yield a slurry. The slurry was molded into a sheet immediately after the preparation by the doctor blade process to yield an insulating green sheet.

Example 4 (Dielectric Green Sheet)

To 6.2% by weight of a powdered borosilicate glass, 56.0% by weight of barium titanate, 6.2% by weight of an organic binder of a carboxyl-group-containing acrylic type, 3.1% by weight of ethanol and 0.5% by weight of hydroxyapatite were added and mixed to yield a slurry. The slurry was molded into a sheet immediately after the preparation by the doctor blade process to yield a dielectric green sheet.

Example 5 (Magnetic Green Sheet)

To 6.2% by weight of a powdered borosilicate glass, 56.0% by weight of nickel zinc ferrite, 6.2% by weight of an organic binder of a carboxyl-group-containing acrylic type, 3.1% by weight of ethanol and 0.5% by weight of hydroxyapatite were added and mixed to yield a slurry. The slurry was molded into a sheet immediately after the preparation by the doctor blade process to yield a magnetic green sheet.

Comparative Example 7 (Insulating Green Sheet)

A mixed slurry having a similar composition to that of Example 3 except containing no hydroxyapatite was prepared. The slurry was molded into a sheet by the doctor blade process to yield an insulating green sheet.

Comparative Example 8 (Dielectric Green Sheet)

A mixed slurry having a similar composition to that of Example 4 except containing no hydroxyapatite was prepared. The slurry was molded into a sheet by the doctor blade process to yield a dielectric green sheet.

Comparative Example 9 (Magnetic Green Sheet)

A mixed slurry having a similar composition to that of Example 5 except containing no hydroxyapatite was prepared. The slurry was molded into a sheet by the doctor blade process to yield a magnetic green sheet.

Each of the green sheets according to Examples 3 to 5 and Comparative Examples 7 to 9 was degreased and was then fired at 900° C. in the air to yield a fired substrate. Each of the obtained fired substrates was subjected to measurement of transverse strength (bending strength) and density. The measurements are shown in Table 3 below.

TABLE 3

Characteristics of Green Sheet

| | Hydroxyapatite | Bending Strength (MPa) | Density (g/cm$^3$) |
|---|---|---|---|
| Example 3 | 0.5 g | 260 | 3.10 |
| Example 4 | 0.5 g | 180 | 5.80 |
| Example 5 | 0.5 g | 150 | 5.85 |
| Comp. Ex. 7 | — | 220 | 2.95 |
| Comp. Ex. 8 | — | 150 | 5.67 |
| Comp. Ex. 9 | — | 110 | 5.55 |

Table 3 shows that the green sheets of the examples are well-balanced in bending strength and density and are mechanically sturdy, high in sinterability and excellent in characteristics as substrates.

In the invented examples above, a fine particle of hydroxyapatite was incorporated into a system of a mixture of an organic binder having a carboxyl group in a side chain with copper or a borosilicate glass. Accordingly, the photosensitive conductive paste containing copper could inhibit the progress of gelation and therefore improved its storage stability to a great extent. Likewise, the photosensitive insulating paste containing a borosilicate glass could also inhibit the gelation and improved its storage stability to a great extent. In addition, slurries prepared for the formation of an insulating green sheet, a dielectric green sheet, or a magnetic green sheet each containing a borosilicate glass could inhibit the gelation to thereby yield homogenous slurries. In the obtained different types of green sheets, no crack was formed even after firing, and the resulting multilayer substrates were mechanically sturdy.

While the invention has been particularly shown and described with reference to preferred embodiments thereof, it will be understood by those skilled in the art that the forgoing and other changes in form and details may be made therein without departing from the spirit of the invention.

What is claimed is:

1. A paste composition comprising a mixture of:
   an organic binder having an acidic functional group;
   at least one polyvalent metal or polyvalent metallic compound; and
   an anion-adsorptive substance having the property of adsorbing an anion of said organic binder.

2. The paste composition according to claims 1, wherein said anion-adsorptive substance is a powder having a mean particle diameter of about 0.01 to 50 $\mu$m.

3. The paste composition according to claim 2, wherein the content of said anion-adsorptive substance is about 0.001 to 30% by weight based on the total weight of the paste composition.

4. The paste composition according to claim 3, wherein said anion-adsorptive substance is at least one member selected from the group consisting of hydroxyapatite, hydrotalcite, zirconium phosphate and antimony oxide hydrate.

5. The paste composition according to claim 3, wherein said anion-adsorptive substance is hydroxyapatite.

6. The paste composition according to claim 1, wherein said organic binder is a (meth)acrylic polymer having a carboxyl group in a side chain.

7. The paste composition according to claim 1, wherein the paste composition is a photosensitive paste which further comprises a photosensitive organic component.

8. The paste composition according to claim 1, wherein said polyvalent metal is at least one powdered metal selected from the group consisting of copper, aluminum, palladium, nickel and iron.

9. The paste composition according to claim 1, wherein said polyvalent metallic compound is a powdered glass; a powdered ceramic comprising at least one member selected from the group consisting of boron, barium, magnesium, aluminum, calcium, lead, bismuth, copper, zinc, zirconium, niobium, chromium, strontium and titanium; or a combination thereof.

10. A multilayer substrate comprising a fired laminate comprising a plurality of layers of the paste composition according to claim 1.

11. A green sheet comprising a molded slurry, said slurry comprising a mixture of:
    an organic binder having an acidic functional group;
    a polyvalent metallic compound; and
    an anion-adsorptive substance having the property of adsorbing an anion of said organic binder.

12. The green sheet according to claim 11, wherein said anion-adsorptive substance is a fine particle having a mean particle diameter of about 0.01 to 50 $\mu$m.

13. The green sheet according to claim 12, wherein the content of said anion-adsorptive substance is about 0.001 to 30% by weight based on the total weight of the slurry.

14. The green sheet according to claim 12, wherein said anion-adsorptive substance is at least one member selected from the group consisting of hydroxyapatite, hydrotalcite, zirconium phosphate and antimony oxide hydrate.

15. The green sheet according to claim 14, wherein said organic binder is a (meth)acrylic polymer having a carboxyl group in a side chain.

16. The green sheet according to claim 15, wherein said anion-adsorptive substance is hydroxyapatite.

17. The green sheet according to claim 11, wherein said slurry further comprises a photosensitive organic component.

18. The green sheet according to claim 11, wherein said polyvalent metallic compound is a powdered glass; a powdered ceramic comprising at least one member selected from the group consisting of boron, barium, magnesium, aluminum, calcium, lead, bismuth, copper, zinc, zirconium, niobium, chromium, strontium and titanium; or a mixture thereof.

19. A multilayer substrate comprising a fired laminate of a plurality of green sheets according to claim 11.

20. A multilayer substrate according to claim 19 having at least one via hole therein.

* * * * *